United States Patent
Terui

(10) Patent No.: US 7,285,974 B2
(45) Date of Patent: Oct. 23, 2007

(54) LARGE SCALE INTEGRATED CIRCUIT

(75) Inventor: Kenji Terui, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 55 days.

(21) Appl. No.: 11/375,062

(22) Filed: Mar. 15, 2006

(65) Prior Publication Data

US 2006/0261854 A1    Nov. 23, 2006

(30) Foreign Application Priority Data

May 17, 2005    (JP)    ............................. 2005-143978

(51) Int. Cl.
*H03K 19/00*    (2006.01)
(52) U.S. Cl. ............................. 326/16; 326/9; 326/101
(58) Field of Classification Search ................... 326/9, 326/14, 16; 324/763, 765; 714/726–727
See application file for complete search history.

(56) References Cited

U.S. PATENT DOCUMENTS 6,275,055 B1    8/2001    Hyozo et al.
6,944,810 B2 *    9/2005    Oberle et al. ................ 714/733
7,230,447 B2 *    6/2007    Whetsel ........................ 326/16

FOREIGN PATENT DOCUMENTS

JP    2000-162284    6/2000

* cited by examiner

*Primary Examiner*—Anh Q. Tran
(74) *Attorney, Agent, or Firm*—Takeuchi & Kubotera, LLP

(57) ABSTRACT

An large scale integrated circuit (LSI) includes an input buffer for adjusting a signal input to an outer input terminal; an input side selector for outputting the signal to a first output side when a normal operation is specified and to a second output side when a test operation is specified; a logic circuit for performing a specific logic process and outputting the signal; a bypass circuit for transferring the signal from the second output side of the input side selector; an output side selector for selecting and outputting the signal from the logic circuit when the normal operation is specified and selecting and outputting the signal transferred through the bypass circuit when the test operation is specified; and an output buffer for amplifying and outputting the signal from the output side selector to an outer output terminal.

8 Claims, 3 Drawing Sheets

LARGE SCALE INTEGRATED CIRCUIT

BACKGROUND OF THE INVENTION

The present invention relates to a large scale integrated circuit (LSI), more specifically, a large scale integrated circuit having a test circuit for conducting a direct current test of an outer terminal.

Tests of an LSI include a function test for checking a logic function of a circuit and a direct current test for checking leak and a voltage level of an outer input terminal or an outer output terminal.

FIG. 2 is a view showing a configuration of the direct current test of an LSI. An LSI 1 to be tested includes a logic circuit 2; a power source terminal 3 for supplying a power source voltage VDD to the logic circuit 2; a ground terminal to be connected to a common ground potential GND; a plurality of input terminals 5 for receiving an input signal; and a plurality of output terminals 6 for outputting a result of a logic process. An LSI may include an input/output terminal to be switched between an input terminal and an output terminal according to an operational state, thereby reducing the number of the outer terminals. In the direct current test, the input/output terminal is separately tested as the input terminal or the output terminal.

As shown in FIG. 2, the input terminal 5 to be tested is connected to a variable voltage source VR capable of outputting an input voltage VI in a range between the ground potential GND and the power source voltage VDD; and a voltage meter VM1 for measuring the input voltage VI. When a level of the input voltage VI changes between levels H and L, an output level at the output terminal 6 changes from level H to level L, or from level L to level H. The output terminal 6 is connected to a voltage meter VM2 for measuring an output voltage VO. The output terminal 6 is further connected to a current source I1 through a switch SW1 for supplying an output current IL flowing from the power source voltage VDD at the level L; and a current source I2 through a switch SW2 for retrieving an output current IH at the level H.

With the configuration described above, when the input voltage test of the input terminal 5 is conducted, the switches SW1 and SW2 are turned off, and the input voltage VI applied to the input terminal 5 is increased from the ground potential GND to the power source voltage VDD. The input voltage is measured and set as a low level input voltage VIL just before the logic level of the corresponding output terminal 6 changes. Then, the input voltage VI applied to the input terminal 5 is decreased from the power source voltage VDD to the ground potential GND. The input voltage is measured and set as a high level input voltage VIH just before the logic level of the corresponding output terminal 6 changes.

When the output voltage test of the output terminal 6 is conducted, the switches SW1 and SW2 are turned off, and the input voltage VI is set so that the out put terminal 6 outputs the specific level L. Then, the switch SW1 is turned on, and the output voltage is measured and set as a low level output voltage VOL. Then, in a state that the switches SW1 and SW2 are turned off, the output terminal 6 outputs the specific level H. In this state, the switch SW2 is turned on, and the output voltage is measured and set as a high level output voltage VOH. When the results are within a specific range, it is determined that the LSI passes the direct current test.

In Patent Reference, an LSI is provided with a test terminal for the direct current test. The LSI is also provided with a switch for sequentially connecting a plurality of test signals for outer connection to the test terminal. Accordingly, even when a LSI tester have test terminals having the number smaller than that of the signal terminals of the LSI, it is possible to conduct the direct current test.

Patent Reference: Japanese Patent Publication No. 2000-162284

In the LSI disclosed in Patent Reference, the input terminal and the output terminal, in which the level of the output signal changes according to the change in the level of the input signal, are combined upon conducting the test. Accordingly, it is necessary to select an optimal combination of the input terminal and the output terminal according to a configuration of a logic circuit, thereby taking long time to set a test condition. Further, it is necessary to concurrently change several levels of the input terminals for changing a single level of the output terminal, thereby taking long time to conduct the test.

In view of the problems described above, an object of the present invention is to provide an LSI having a test circuit capable of conducting the direct current test regardless of a configuration of a logic circuit.

Further objects will be apparent from the following description of the invention.

BRIEF SUMMARY OF THE INVENTION

In order to achieve the objects described above, according to the present invention, a large scale integrated circuit (LSI) includes an input buffer for adjusting a level of a signal input to an outer input terminal; an input side selector for outputting the signal from the input buffer to a first output side when a normal operation is specified through a mode signal and to a second output side when a test operation is specified through the mode signal; a logic circuit for performing a specific logic process and outputting a signal of a processed result according to an output signal from the first output side of the input side selector; a bypass circuit for transferring a signal from the second output side of the input side selector; an output side selector for selecting and outputting the signal from the logic circuit when the normal operation is specified through the mode signal and selecting and outputting the signal transferred through the bypass circuit when the test operation is specified through the mode signal; and an output buffer for amplifying and outputting a signal from the output side selector to an outer output terminal.

In the present invention, when the test operation is specified, it is arranged to form a bypass route from the outer input terminal to the outer output terminal through the input buffer, the input side selector, the bypass circuit, the output side selector, and the output buffer without passing through the logic circuit. Accordingly, the outer input terminal corresponds to the outer output terminal one to one, thereby making it possible to conduct a direct current test of the outer terminals regardless of a configuration of the logic circuit.

DETAILED DESCRIPTION OF PREFERRED EMBODIMENTS

Hereunder, embodiments of the present invention will be described below with reference to the accompanying drawings.

A large scale integrated circuit (LSI) may have outer input terminals having the number different from that of outer output terminals. Accordingly, the following three routes are used together for a direct current test; a direct route in which a signal is output from a second output side of an input side selector and the signal is transferred to a corresponding output side selector; a branch route in which a signal is output from the second output side of the input side selector and divided into a plurality of signals to be transferred to a plurality of corresponding output side selectors; and an aggregated route in which a plurality of signals is output from the second output side of the input side selector, and the signals are aggregated at a logic gate and transferred to a corresponding output side selector. Accordingly, it is possible to perform the direct current test for all of the outer terminals.

Figure 1:
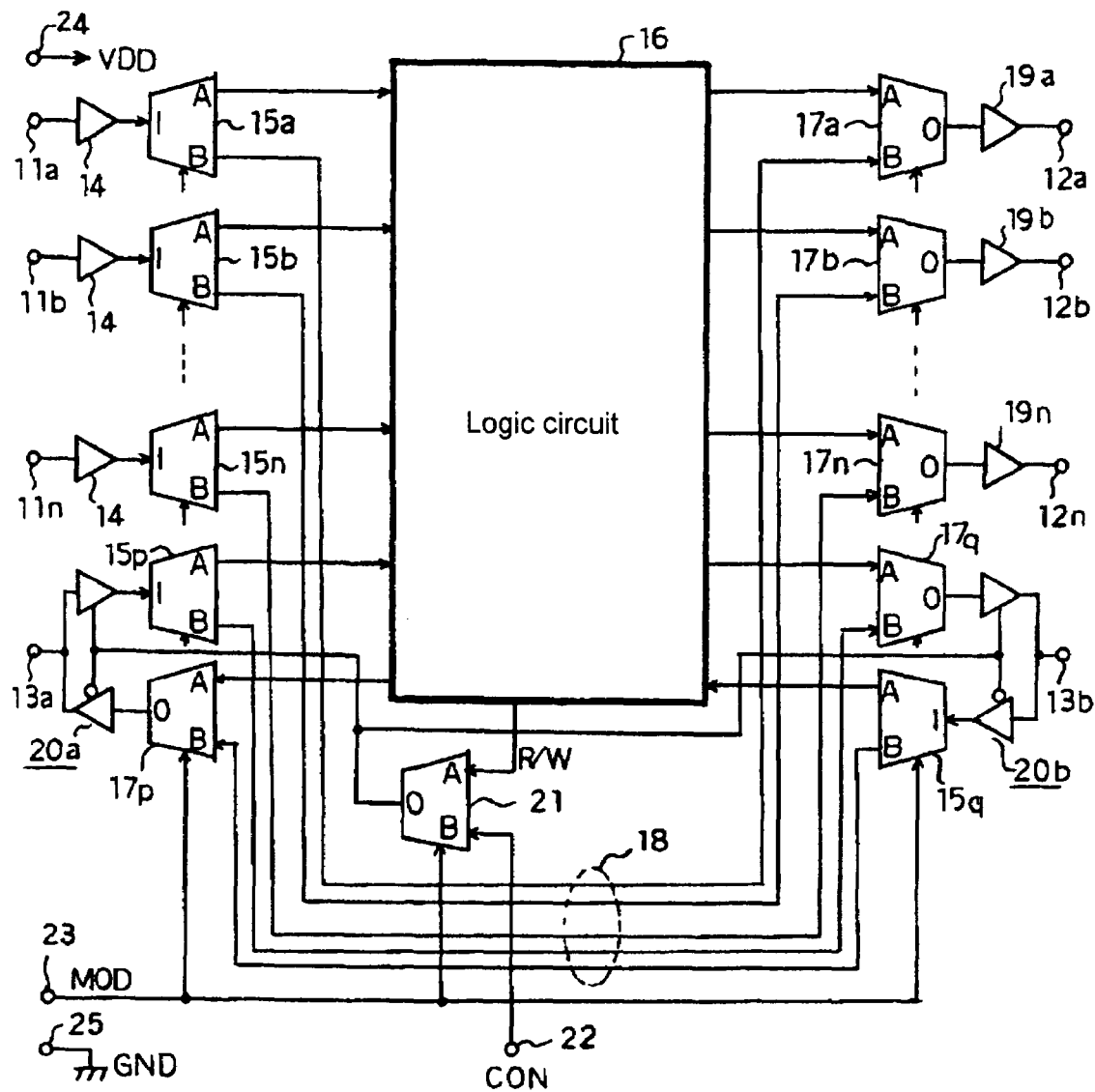
FIG. 1 is a schematic diagram showing a configuration of an LSI according to an embodiment of the present invention.

FIG. 1 is a schematic diagram showing a configuration of an LSI according to an embodiment of the present invention. The LSI includes a plurality of outer input terminals 11a to 11n; a plurality of outer output terminals 12a to 12n; and a plurality of outer input/output terminals 13a and 13b. The outer input terminals 11a to 11n are connected to input terminals I of input side selectors 15a to 15n through input buffers 14a to 14n, respectively.

The input buffers 14a to 14n are provided for correcting a level variation due to noise and the like overlapped on an input signal, thereby preventing an error. The input buffers 14a to 14n are formed of, for example, the Schmidt circuit. The input side selectors 15a to 15n are provided for outputting signals sent to input terminals I to output terminals A when a normal operation is specified through a mode signal MOD sent to a control terminal, and for outputting the signals to output terminals B when a test operation is specified through the mode signal MOD. The input terminals A of the input side selectors 15a to 15n are connected to corresponding input terminals of a logic circuit 16, respectively.

The logic circuit 16 is provided for performing a specific logic process on the signals sent to the input terminals thereof, and for outputting signals of processed results. A plurality of output terminals of the logic circuit 16 is connected to input terminals A of output side selectors 17a to 17b, respectively. Each of the output side selectors 17a to 17b includes input terminals A and B and an output terminal O. The output side selectors 17a to 17n are provided for outputting the signals sent to the input terminals A to the output terminals O when the normal operation is specified through the mode signal MOD sent to the control terminal, and for outputting the signals sent to the input terminals B to the output terminals O when the test operation is specified through the mode signal MOD. The input terminals B of the output side selectors 17a to 17n are connected to the corresponding output terminals B of the input side selector 15a to 15n through a bypass circuit 18, respectively.

The output terminals of the output side selectors 17a to 17n are connected to output buffers 19a to 19n, respectively. Output sides of the output buffers 19a to 19n are connected to the outer output terminals 12a to 12n. The output buffers 19a to 19n are provided for amplifying output signals to increase drive performance, thereby reducing signal delay in an external wiring.

The outer input/output terminal 13a is connected to an input terminal I of an input side selector 15p and an output terminal O of an output side selector 17p through a bidirectional buffer 20a. The outer input/output terminal 13b is connected to an input terminal I of an input side selector 15q and an output terminal O of an output side selector 17q through a bidirectional buffer 20b. The bidirectional buffer 20a and 20b switch input/output through a control signal R/W (CON) sent to a control terminal. The control signals R/W and CON are sent to control terminals of the bidirectional buffers 20a and 20b from the logic circuit 16 and a test terminal 22, respectively, through a selector 21 switching through the mode signal MOD.

In the embodiment, the LSI further includes a test terminal 23 for receiving the mode signal MOD; a power source terminal 24 for receiving the power source voltage VDD to be supplied to the logic circuit 16, the buffers, and the selectors; and a ground terminal 25 to be connected to the ground potential GND.

Figure 2:
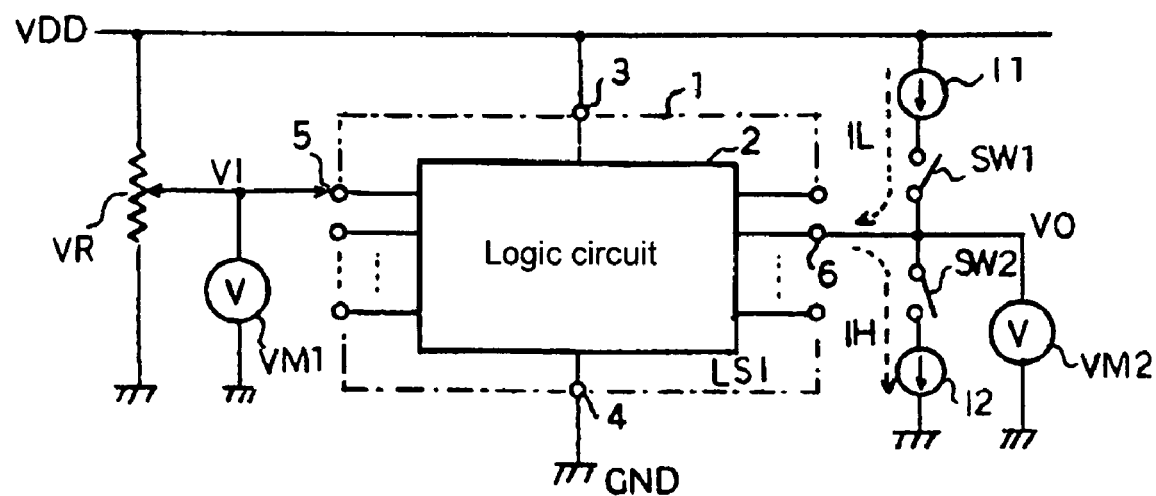
FIG. 2 is a view showing a configuration of the direct current test of an LSI.

An operation of the LSI shown in FIG. 1 in the direct current test will be explained next. FIG. 2 is a view showing a configuration of the direct current test, in which the LSI shown in FIG. 1 is mounted as an LSI 1 in FIG. 2. The mode signal MOD to be sent to the test terminal 23 is set to the test operation mode (for example, level H). With this operation, each of the input side selectors 15 in the LSI is switched to a side of the output terminal B, and each of the output side selectors 17 in the LSI is switched to a side of the input terminal B. Further, the selector 21 is switched to a side of the input terminal B.

In the test operation mode, the logic circuit 16 of the LSI is completely isolated from the outer connection terminals. The outer input terminal 11a is connected to the outer output terminal 12a through the input buffer 14a, the input side selector 15a, the bypass circuit 18, the output side selector 17a, and the output buffer 19a. Similarly, the outer input terminals 11b to 11n are connected to the outer output terminals 12b to 12n through the bypass circuit 18 without passing through the logic circuit 16.

When the control signal CON to be sent to the test terminal 22 is set to the level H, the outer input/output terminals 13a and 13b operate as the outer input terminal and the outer output terminal, respectively. When the control signal CON to is set to a level L, the outer input/output terminals 13a and 13b operate as the outer output terminal and the outer input terminal, respectively. For example, when the control signal CON to is set to the level L, the outer input/output terminal 13a is connected to the outer input/output terminal 13b through the bidirectional buffer 20a, the input side selector 15p, the bypass circuit 18, the output side selector 17q, and the bidirectional buffer 20b.

After the LSI is connected as a test subject as described above, the input voltage test of the outer input terminals 11a to 11n and the outer input/output terminal 13a is conducted. Also, the output voltage test of the outer output terminals 12a to 12n and the outer input/output terminal 13b is conducted. The input voltage test and the output voltage test are described above already in detail.

When the test operation mode is set, the outer input terminal corresponds to the outer output terminal one to one through the bypass circuit 18 regardless of a configuration of the logic circuit 16. Accordingly, when one of the outer input terminals is subjected to the input voltage test, it is necessary to just watch an output level of an outer output terminal corresponding to the one of the outer input terminals. Further, when one of the outer output terminals is subjected to the output voltage test, it is necessary to just apply a test level for setting an output level to an outer input terminal corresponding to the one of the outer output terminals.

After the LSI passes the direct current test and other function tests, the LSI is mounted on a device with the test terminal 22 fixed to the level L or H. The test terminal 23 is fixed to the level L to set the normal operation mode. Accordingly, when the outer input terminal 11 receives a signal, the signal is sent to the logic circuit 16 through the input buffer 14 and the input side selector 15. After the logic circuit 16 processes the signal, the resultant signal is output to the outer output terminal 12 through the output side selector 17 and the output buffer 12.

As described above, in the embodiment, the LSI includes the input side selector 15 on the output side of the input buffer 11 connected to the outer input terminal 11, and the output side selector 17 before the output buffer 18 driving the outer output terminal 12. When the mode signal MOD is set to the test operation mode, the input side selector 15 is connected to the output side selector 17 through the bypass circuit 18 while the logic circuit 16 is isolated. Accordingly, in the test operation mode, the outer input terminal 11 corresponds to the outer output terminal 12 one to one, thereby making it possible to conduct the direct current test of the outer terminals regardless of a configuration of the logic circuit.

Figure 3:
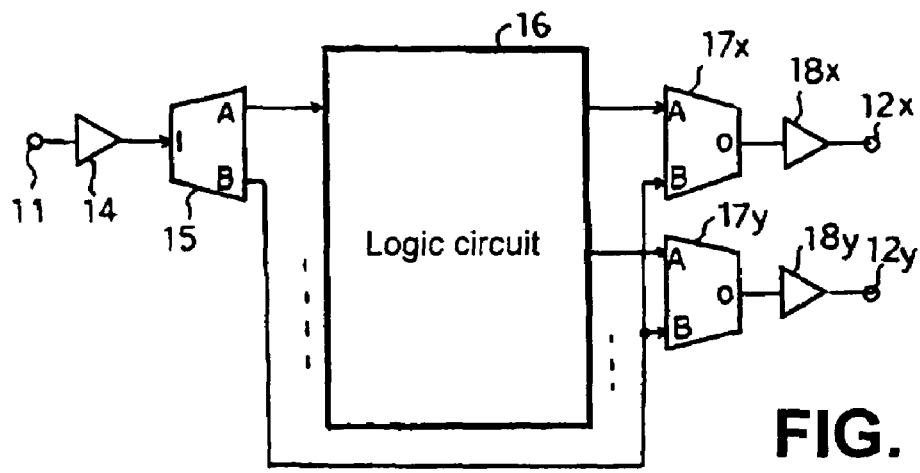
FIGS. 3(*a*) to 3(*c*) are schematic views showing modified examples of the LSI shown in FIG. 1.
Figure 3:
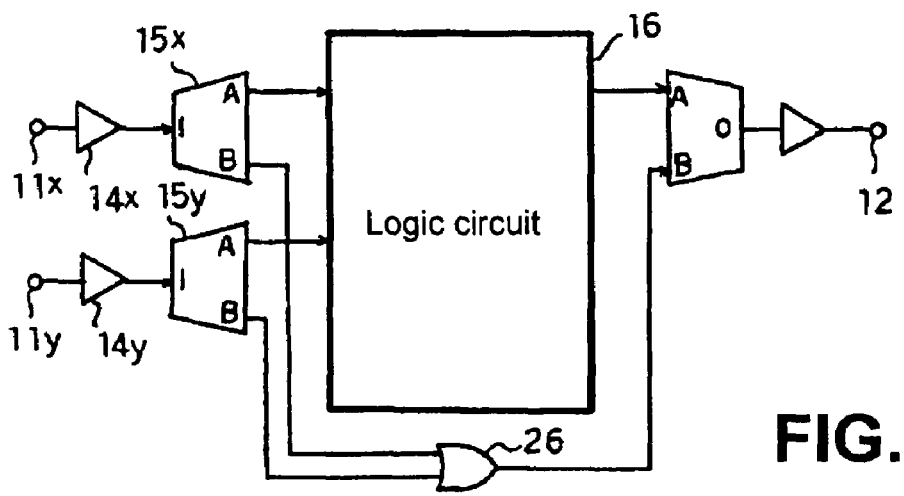
Figure 3:
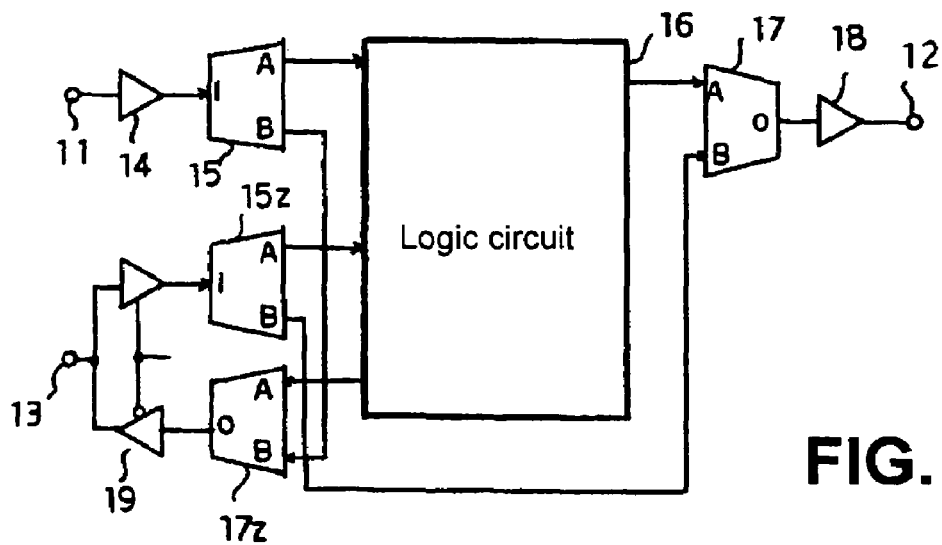

The present invention is not limited to the embodiment described above, and various modifications are possible. For example, in the LSI shown in FIG. 1, the number of the outer input terminals is the same as that of the outer output terminals. The bypass circuit constitutes the direct route. In a general configuration, the number of the outer input terminals is not the same as that of the outer output terminals. In such as case, the following modifications are applicable. FIGS. 3(a) to 3(c) are schematic views showing modified examples of the LSI shown in FIG. 1.

In the example shown in FIG. 3(a), the number of the outer input terminals is smaller that of the outer output terminals. In this case, a signal from the output terminal B of the input side selector 15 is divided through the branch route and sent to input terminals of output side selectors 17x and 17y. When the outer input terminal 11 is subjected to the input voltage test, it is necessary to just watch an output level of one of outer output terminals 12x and 12y. Further, when one of the outer output terminals 12x and 12y is subjected to the output voltage test, it is necessary to just apply a common test level for setting an output level to the outer input terminal 11 for testing output voltages of the outer output terminals 12x and 12y separately.

In the example shown in FIG. 3(b), the number of the outer input terminals is greater that of the outer output terminals. In this case, output terminals B of input side selectors 15x and 15y are aggregated through a logic gate such as an OR 26, and are connected to the input terminal B of the output side selector 17. When one of outer input terminals 11x and 11y is subjected to the input voltage test, the other of the outer input terminals 11x and 11y is fixed to the ground potential GND, and it is necessary to just watch a level of the outer output terminal 12. Further, the output voltage test of the outer output terminal 12 can be performed similarly.

In the example shown in FIG. 3(c), there is no pair of the outer input/output terminals. In this case, one outer input/output terminal 13 is combined with a pair of the outer input terminal 11 and the outer output terminal 12. When the outer input/output terminal 13 is tested as the output terminal, the test is performed while the outer input terminal 11 corresponds to the outer input/output terminal 13. When the outer input/output terminal 13 is tested as the input terminal, the test is performed while the outer output terminal 12 corresponds to the outer input/output terminal 13.

The disclosure of Japanese Patent Application No. 2005-143978, filed on May 17, 2005, is incorporated in the application.

While the invention has been explained with reference to the specific embodiments of the invention, the explanation is illustrative and the invention is limited only by the appended claims.

What is claimed is:

1. A large scale integrated circuit, comprising:
   an outer input terminal for receiving a signal;
   an input buffer for adjusting a level of the signal;
   an input side selector for receiving the signal from the input buffer and outputting the signal through a first output side thereof in a normal operation mode and through a second output side thereof in a test operation mode;
   a logic circuit for performing a specific logic process on the signal from the first output side of the input side selector;
   a bypass circuit for receiving the signal from the second output side of the input side selector and transferring the signal;
   an output side selector for selecting the signal from the logic circuit in the normal operation mode and the signal from the bypass circuit in the test operation mode, and outputting the signal;
   an output buffer for receiving the signal from the output side selector, and amplifying and outputting the signal; and
   an outer output terminal for receiving the signal from the output buffer and outputting the signal.

2. The large scale integrated circuit according to claim 1, further comprising an outer input/output terminal for receiving and outputting the signal.

3. The large scale integrated circuit according to claim 1, further comprising a test terminal for receiving a mode signal to select one of the normal operation mode and the test operation mode.

4. The large scale integrated circuit according to claim 1, wherein said input side selector includes a plurality of input side selector units.

5. The large scale integrated circuit according to claim 1, wherein said output side selector includes a plurality of output side selector units.

6. The large scale integrated circuit according to claim 1, wherein said bypass circuit includes a direct route for transferring the signal from the second output side of the input side selector directly to the output side selector.

7. The large scale integrated circuit according to claim 5, wherein said bypass circuit includes a branch route for dividing the signal into a plurality of divided signals and transferring the divided signals to the output side selector units.

8. The large scale integrated circuit according to claim 4, wherein said bypass circuit includes a logic gate for aggregating the signals from the input side selector units to form an aggregated signal, and an aggregated route for transferring the aggregated signal to the output side selector.

* * * * *